United States Patent
Burkhard

(10) Patent No.: US 6,617,096 B2
(45) Date of Patent: Sep. 9, 2003

(54) METHOD OF PRODUCING AN INTEGRATED CIRCUIT CONFIGURATION

(75) Inventor: Ludwig Burkhard, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/976,233

(22) Filed: Oct. 12, 2001

(65) Prior Publication Data

US 2002/0086241 A1 Jul. 4, 2002

Related U.S. Application Data

(63) Continuation-in-part of application No. 09/317,764, filed on May 24, 1999, now abandoned.

(30) Foreign Application Priority Data

May 22, 1998 (DE) .......................... 198 23 035

(51) Int. Cl.$^7$ .......................... G03F 7/00; H01L 21/76; G06F 17/50
(52) U.S. Cl. .......................... 430/314; 430/5; 430/311; 430/313; 430/314; 430/317; 438/296; 438/404; 438/424; 438/437; 438/692; 716/19
(58) Field of Search .......................... 430/5, 311, 313, 430/314, 317; 438/296, 404, 424, 437, 692, 697; 716/19

(56) References Cited

U.S. PATENT DOCUMENTS

| 5,104,482 A | 4/1992 | Monkowski | 438/698 |
|---|---|---|---|
| 5,516,625 A | 5/1996 | McNamara et al. | 430/314 |
| 5,581,110 A | 12/1996 | Razouk | 257/513 |
| 5,597,668 A * | 1/1997 | Nowak et al. | 430/5 |
| 5,691,215 A | 11/1997 | Dai | 438/305 |
| 5,926,723 A * | 7/1999 | Wang | 438/437 |
| 2002/0001919 A1 * | 1/2002 | Chen et al. | 438/424 |

OTHER PUBLICATIONS

Jpn. J. Appl. Phys. vol. 35 (1996), pp. 4618–4623 (Roh et al.), Part 1, No. 9A, Sep. 1996, Easily Manufacturable Shallow Trench Isolation for Gigabit Dynamic Random Access Memory.

IEDM 89, pp. 61–64 (Davari et al.), A New Planarization Technique, Using a Combination of Rie and Chemical Mechanical Polish (CMP); 1989.

* cited by examiner

Primary Examiner—Mark F. Huff
Assistant Examiner—Nicole Barreca
(74) Attorney, Agent, or Firm—Laurence A. Greenberg; Werner H. Stemer; Gregory L. Mayback

(57) ABSTRACT

A method of producing an integrated circuit configuration where trenches are formed surrounding active regions in a main surface of a semiconductor substrate. A photoresist layer is applied to the insulating layer and structured forming a mask using a data processing device, by the following steps: Providing an idealized pattern representing trenches with contours corresponding to contours of the trenches. Producing an idealized mask pattern on the basis of the idealized pattern shifted by an allowance in comparison with the idealized pattern, the idealized mask pattern has surface zones whose distance apart is shorter than a given minimum measurement. The idealized mask pattern is used to produce a further idealized mask pattern in which the surface zones are replaced by minimum surface elements with length measurements which are greater than the given minimum measurement. The trenches are then filled by depositing an insulating layer using the formed mask.

5 Claims, 3 Drawing Sheets

METHOD OF PRODUCING AN INTEGRATED CIRCUIT CONFIGURATION

CROSS-REFERENCE TO RELATED APPLICATION

This is a continuation-in-part application of U.S. application No. 09/317,764, filed May 24, 1999 now abandoned.

BACKGROUND OF THE INVENTION

Field of the Invention

The present invention relates to a method of producing an integrated circuit configuration in which active regions are surrounded and insulated by trenches filled with insulating material.

Increasingly, integrated circuits are configured in which active regions are insulated from one another by trenches which are filled with insulating material and surround the active regions. In this specialist area, such insulation is called shallow trench isolation (STI).

To produce an integrated circuit with shallow trench isolation, trenches defining active regions are first etched in a main surface of a semiconductor substrate. The trenches are then filled with insulating material. One problem with this is the formation of a planar surface over the whole semiconductor substrate.

A proposal has been made (see B. Davaria et al., IEDM 89, pages 61 to 64), for filling the trenches, to start by depositing a first insulating layer, which is planarized by chemical mechanical polishing using a photoresist mask and a planarizing lacquer layer. In this case, the photoresist mask has structures covering the low-lying surface zones of the insulating layer. This ensures that the planarizing second photoresist layer has only slight surface variations, which can be compensated for during chemical mechanical polishing. In this method, the photoresist mask is generated from the mask used to produce the trenches, the pattern of the photoresist mask corresponding to the pattern of the trenches, but the lateral measurements of the patterns in the photoresist mask being reduced by a lateral allowance in comparison with the width of the trenches. Since a minimal structure width dependent on the respective technology cannot be undershot when the photoresist mask is formed, the trenches in any zones of the photoresist mask in which the pattern, defined using the trench pattern, of the photoresist mask does not fulfill this condition will be underfilled or overfilled, which has disadvantageous consequences for the planarity that can be achieved.

SUMMARY OF THE INVENTION

It is accordingly an object of the invention to provide a method of producing an integrated circuit configuration which overcomes the above-mentioned disadvantages of the prior art devices of this general type, in which greater planarity is achieved than in the prior art.

With the foregoing and other objects in view there is provided, in accordance with the invention, a method for producing an integrated circuit configuration, which includes the forming of trenches surrounding active regions in a main surface of a semiconductor substrate. Applying a photoresist layer to the insulating layer and structuring the applied photoresist layer to form a mask, using a data processing device, by the following steps:

providing an idealized pattern representing trenches formed in the semiconductor substrate and having contours which correspond to contours of the trenches and having idealized active regions which represent the active regions in the semiconductor substrate;

producing an idealized mask pattern on the basis of the idealized pattern containing rectilinear contours which are shifted by an allowance in comparison with the idealized pattern, the allowance starting on that side of the idealized active regions which is respectively remote therefrom, the idealized mask pattern having surface zones defined therein which are bounded by the rectilinear contours whose distance apart is shorter than a given minimum measurement; and using the idealized mask pattern to produce a further idealized mask pattern in which the surface zones are replaced by minimum surface elements having length measurements which are greater than the given minimum measurement where a surface of the minimum surface elements essentially corresponds to a surface of the surface zone which the minimum surface elements are replacing, and where the mask is formed from the further idealized mask pattern.

Filling the trenches by depositing an insulating layer using the formed mask.

In one embodiment of the method, the idealized mask pattern has surface regions defined in it which are spaced apart from adjacent surface regions by a distance which is greater than the prescribed minimum measurement, and replacing surface zones arranged in these surface regions by the minimum surface elements.

In another embodiment of the method, the surface zones whose surface is smaller than the surface of a minimum surface element are replaced by the minimum surface element, controlled on the basis of a probability corresponding to the quotient formed by the surface of the surface zone and the surface of the minimum surface element.

In another embodiment of the method, having the step of planarizing the insulating layer by chemical mechanical polishing after the further photolayer has been applied.

In another embodiment of the method, the prescribed minimum measurement is at least as large as the length of a smallest structure which can be produced in the mask, and in that one of the minimum surface elements is rectangular, the sides of the rectangle having a length which is respectively at least as great as the length of the smallest structure which can be produced in the mask.

In the method, trenches defining active regions are produced in a main surface of a semiconductor substrate. The trenches are filled by depositing an insulating layer and by a planarization process, using a mask. The mask is produced in that, on the basis of the pattern of the trenches, a data processing device is used to define an idealized pattern which represents the semiconductor substrate's structures to be planarized. This pattern is used to define an idealized mask pattern. This idealized mask pattern contains raised structures which correspond to the pattern of the trenches but whose measurements are reduced parallel to the main surface by a lateral allowance in comparison with the measurements in the pattern of the trenches. This means that the rectilinear contours or the edges in the idealized mask pattern point in the direction away from the active regions enclosed by the trenches. The allowance starts on that side of the contours which is not situated on the same side as the adjoining active region. The idealized mask pattern subsequently has surface zones defined in it, in the data processing device, whose measurement in at least one dimension parallel to the main surface is smaller than a predetermined minimum measurement. The distance between the rectilinear contours forming the surface zone at least on two opposite sides is shorter than the minimum distance. The overall contour of the surface zone is composed from respectively rectilinear portions. The data processing device replaces these zones in the idealized mask pattern by auxiliary structures which have minimum surface elements. This finally produces a further idealized mask pattern. In the dimensions or directions parallel to the main surface, the minimum surface elements each have length measurements or lateral lengths of at least one predetermined minimum measurement. In this instance, the sum of the surfaces of the minimum surface elements in an auxiliary structure corresponds essentially to the surface of the surface zone in the idealized mask pattern, which surface zone is replaced by the respective auxiliary structure. The predetermined minimum measurement will in practice be essentially the same as the structure size which can be produced as a minimum in the respective technology. The further idealized mask pattern, obtained from the data processing device, is converted into the mask formed from the photoresist on the semiconductor substrate.

The surfaces of the minimum surface elements have a minimum surface defined by the minimum measurement, since the respective lateral length of the minimum surface is greater than the minimum measurement. The distance between opposite sides is greater than the minimum measurement. The minimum surface elements can also be larger than this minimum surface. The minimum surface elements are of rectangular design. Each side of the rectangle is longer than the minimum measurement. The surface zones to be replaced are likewise rectangular. They are delimited on at least two opposite sides by contours of the idealized mask pattern. In this case, the distance between these at least two opposite contours is shorter than the minimum distance.

The idealized mask pattern's surface zones in which, in one dimension or direction, the measurement is smaller than the predetermined minimum measurement are zones in which the trenches are underfilled in the method known from the prior art. The predetermined minimum measurement is at least as large as the shortest length of a structure which can be produced in the mask. A minimum surface element is rectangular, and the lateral lengths of the rectangle are each of a length having at least the predetermined minimum measurement, that is to say being at least as long as the length of a smallest structure which can be produced in the mask.

The invention solves this problem in that, in the idealized mask pattern, these surface zones are provided with minimum surface elements whose overall surface essentially corresponds to the surface of the zone replaced by the minimum surface elements. In this context, the invention makes use of the realization that optimum planarization is essentially dependent on the surface coverage being essentially constant over the main surface. The idealized mask pattern fulfills this condition. It is infringed again only by the additional conditions of the technology with regard to minimal structure width. Replacing such zones, according to the invention, with the auxiliary structure described ensures uniform surface coverage, however. Defining the auxiliary structure requires only two dimensions to be considered.

The idealized mask pattern is defined automatically on the basis of the pattern of the trenches, the lateral allowance and the predetermined minimum measurement, using a data processing program running on a computer.

With regard to the quantity of data to be processed and the computation time required, it is advantageous to define surface regions in the idealized mask pattern which are each surrounded by a structure whose measurements parallel to the main surface are larger than the predetermined minimum measurement. This means that two adjacent regions are spaced apart by a distance in length which is longer than the minimum distance. On the other hand, such a surface region can contain trench contours which enclose individual active regions and whose distance apart is shorter than the minimum measurement. The minimum surface elements are the kind which are delimited on at least two opposite sides by mask contours. The auxiliary structures are then defined in these regions in each case. This considerably reduces the quantity of data to be taken into account. In addition, parts of the mask are prevented from being processed in which there is no infringement of the condition regarding the minimum measurement.

According to one refinement of the invention, zones whose measurements in at least one dimension parallel to the main surface are smaller than the predetermined minimum measurement and whose surface is smaller than the surface of one of the minimum surface elements are replaced in the data processing device by a minimum surface element with a probability corresponding to the quotient formed by the surface of the zone and the surface of the minimum surface element. This means that replacement is controlled on the basis of probability. If, gradually, one of these surface zones after the other is regarded in the data processing device, for example, then a replacement by a minimum surface element is made or is not made on the basis of a probability generator. The parameter controlling the probability generator is the quotient of the surface of the surface zone and the surface of the minimum surface element. The probability control is thus based on the quotient of the surface zone whose surface is smaller than that of a minimum surface element and the minimum surface element. This results in photoresist starting to be deposited, said deposit having minimum surface elements and having, to some extent "on average", a proportion of photoresist which corresponds to the surfaces of the surface zones. In this context, the desired condition that the structure sizes be greater than F and that the surface sizes be greater than F×F is observed. This compensates for errors which, if these zones with a small surface were neglected, would arise particularly in those parts of the mask in which a number of excessively small zones are disposed at regular intervals.

Planarization can involve any known planarization methods which use a mask to compensate for unevenness in a surface that is to be planarized.

According to one refinement of the invention, the mask is formed from a first photoresist layer. The mask is derived from the idealized mask structure ascertained in the data processing device using the steps described above. A second, flowing photoresist layer is subsequently applied to this mask. The surface of the substrate is then planarized by chemical mechanical polishing. Chemical mechanical polishing is ended as soon as the main surface of the substrate has been reached. To protect the active regions, it is advantageous in this case to provide them with a protective layer made of silicon nitride or silicon oxide before the trenches are etched.

According to a further refinement of the invention, the insulating layer is structured using the mask. This produces insulating structures in the trenches. A flowable insulating layer, preferably a glass layer, is subsequently deposited and made to flow. This achieves planarity for the structure. To expose the surface of the active regions, the glass layer which has flowed can be back-etched isotropically or anisotropically.

Other features which are considered as characteristic for the invention are set forth in the appended claims.

Although the invention is illustrated and described herein as embodied in method of producing an integrated circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
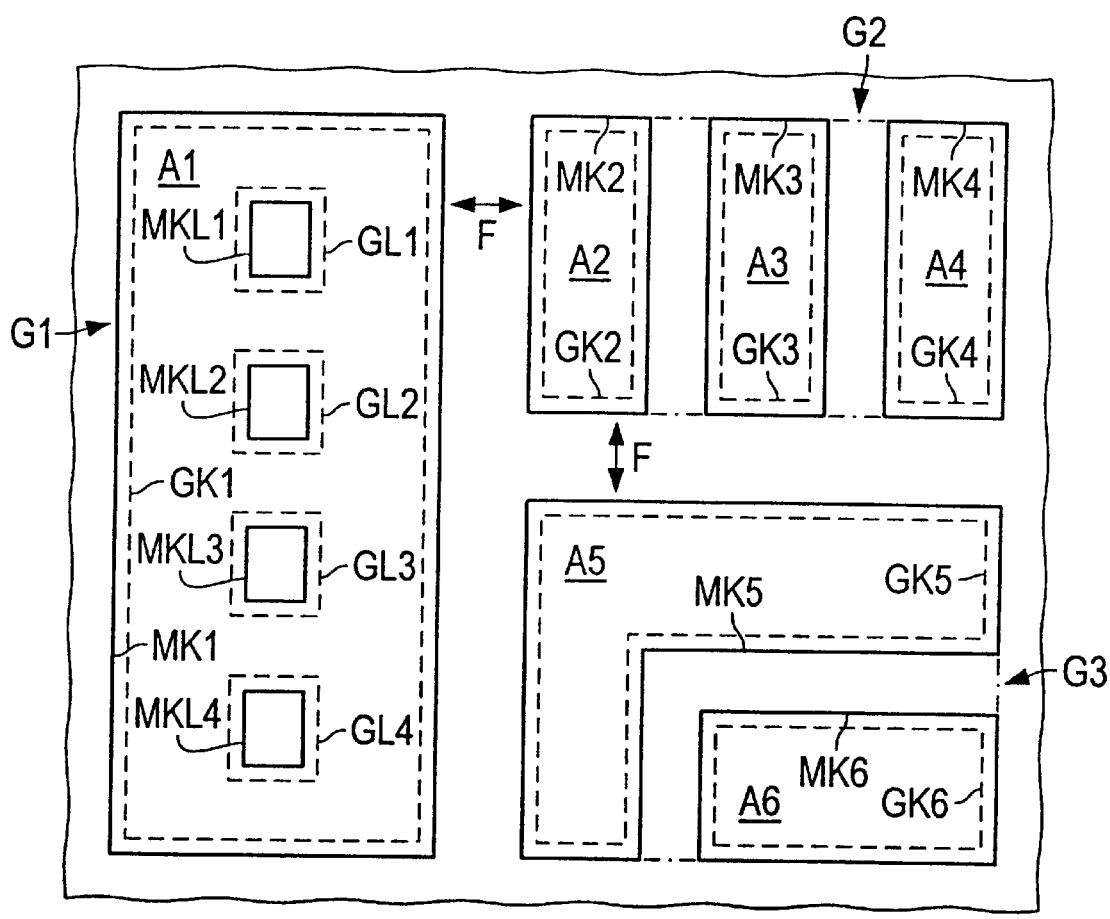
FIG. 1 is a diagrammatic, plan view of an idealized mask pattern according to the invention.

The illustrations in the figures are not to scale.

DESCRIPTION OF THE PREFERRED EMBODIMENTS

In all the figures of the drawing, sub-features and integral parts that correspond to one another bear the same reference symbol in each case. Referring now to the figures of the drawings in detail and first, particularly, to FIG. 1 thereof, there is shown a detail from a layout used to produce insulating trenches in a main surface of a semiconductor substrate. Dashed contours show the contours of the trenches. A first trench contour GK1 defines a first active region A1. Hole-like trenches GL1, GL2, GL3, GL4 are disposed inside the first active region A1.

A second trench contour GK2 defines a second active region A2, a third trench contour GK3 defines a third active region A3, a fourth trench contour GK4 defines a fourth active region A4, a fifth trench contour GK5 defines a fifth active region A5 and a sixth trench contour GK6 defines a sixth active region A6.

On the basis of the trench contours GK1, GK2, GK3, GK4, GK5 and GK6, an idealized mask pattern (shown as solid contours in FIG. 1) is produced by assigning each trench contour GKi a mask contour MKi. The mask contour MKi is in each case larger than the associated trench contour GKi by an allowance which is dependent on the technology. With 0.4 $\mu$m technology, the allowance is 0.5 to 0.8 $\mu$m. The allowance is directed such that it is situated outside the edges enclosing the active regions.

FIG. 1 additionally shows, as a double-headed arrow, a structure size F which can be produced as a minimum. Structures in an authentic photoresist mask can have the measurement F as a minimum.

In the layout shown, the distance between the first mask contour MK1 and the second mask contour MK2 and the fifth mask contour MK5 has a greater value than F. The distance between the second mask contour MK2, the third mask contour MK3 and the fourth mask contour MK4, on the one hand, and the fifth mask contour MK5 on the other is likewise greater than F. The distance between the second mask contour and the third mask contour MK3, and the third mask contour MK3 and the fourth mask contour MK4, and between the fifth mask contour MK5 and the sixth mask contour MK6 is less than F, however.

To generate an authentically producible photoresist mask, that is to say a photoresist mask in which all the measurements are at least as large as a minimum measurement F, the layout has defined surface regions G1, G2, G3 which have a greater distance between one another than the minimum measurement F. The surface regions comprise two or more active regions surrounded by the edges of the idealized mask pattern, the distance between these edges being shorter than the minimum distance. The distance of the formed surface regions themselves from one another is greater than the minimum distance.

Figure 2:
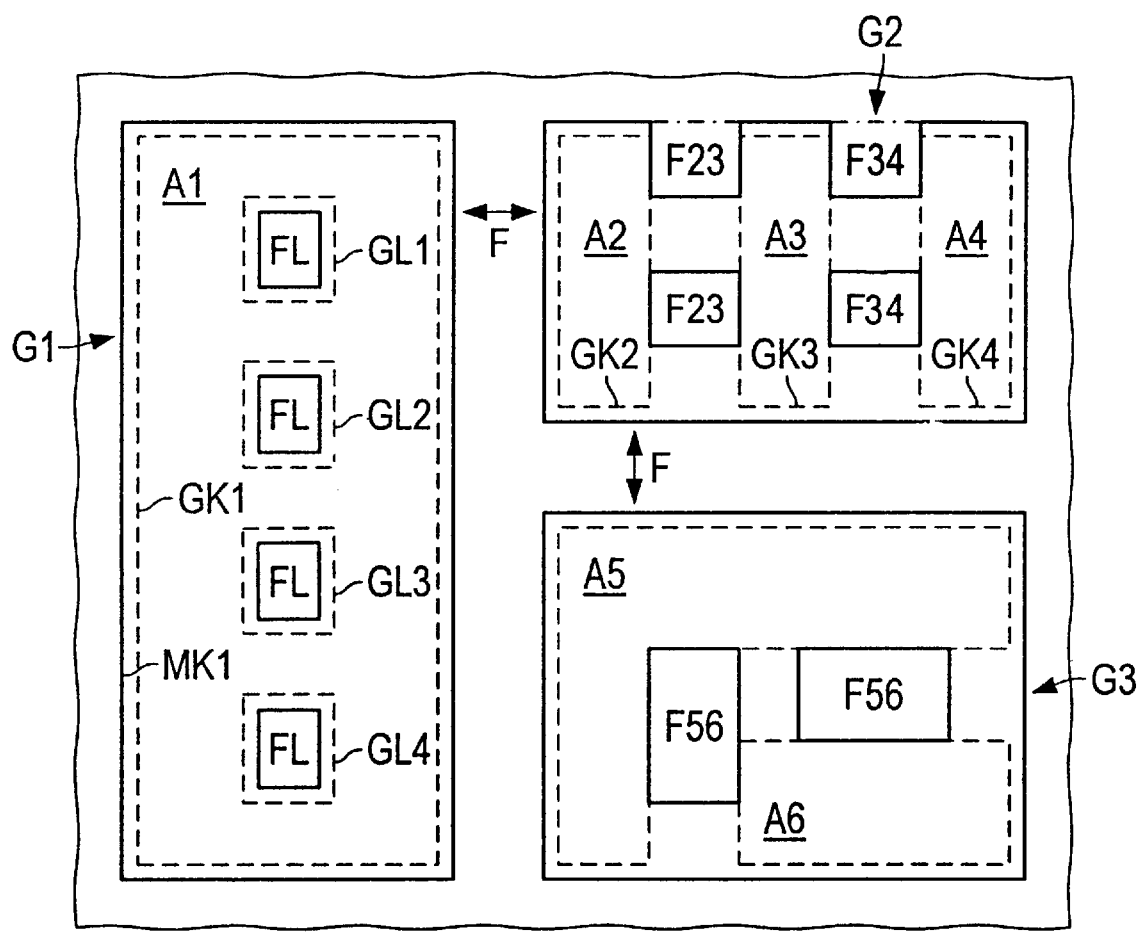
FIG. 2 is a plan view of a mask which was defined using the idealized mask pattern shown in FIG. 1.

A first region G1 comprises the first active region A1, and a second region G2 comprises the second active region A2, the third active region A3 and the fourth active region A4. A third region G3 comprises the fifth active region A5 and the sixth active region A6 (see FIG. 1 and FIG. 2, where the second region G2 and the third region G3 are surrounded by a dot-dashed line in each case).

To generate the mask data, the distances between adjacent mask contours MKi, MKj are defined for each of the regions G1, G2, G3. In line with the definition of the regions G1, G2, G3, these distances are less than F. Next, for the respective region, the surface of the zone enclosed in the region by the adjacent mask contours MKi, MKj is defined. The surface zones to be replaced are delimited on at least two sides by opposite adjacent mask contours. These adjacent mask contours are at a distance which is shorter than the minimum measurement. In addition, the rectangular surface zone is formed by the extension of further mask contours. The surface zones are delimited by rectilinear contours. These contours touch one another at right angles, so that opposite contours run parallel to one another and a mutual spacing between opposite contours can be ascertained. Minimum surface elements are then defined which are rectangular and whose lateral lengths have the length of at least one minimum measurement F. Furthermore, the sum of the surfaces of the minimum surface elements corresponds to the surface of the zone which is defined by the adjacent mask contours MKi, MKj. A zone defined by adjacent mask contours MKi, MKj is replaced in the idealized mask pattern, from which the authentic mask pattern is formed, by minimum surface elements Fi,j whose measurements and distances are greater than or the same as the minimum measurement F.

If the surface of the zone is less than a minimum surface of F×F, as is the case in the first active region A1 for the mask contours MKL1, MKL2, MKL3, MKL4 in the hole-like trenches GL1, GL2, GL3, GL4, then the respective mask contour MKLi is replaced by a minimum surface element FL with a defined probability. The probability is calculated as the quotient formed by the (excessively small) surface of the mask contour MKLi and the surface of a minimum surface element with minimum size F×F.

Zones that are bounded by adjacent mask contours and do not form a simple rectangle, as is the case for the zone between the fifth mask contour MK5 and the sixth mask contour MK6, are broken down into a number of rectangles for defining the minimum surface elements F56.

In the authentic mask pattern obtained in this way, all the distances and measurements are at least F.

Figure 3:
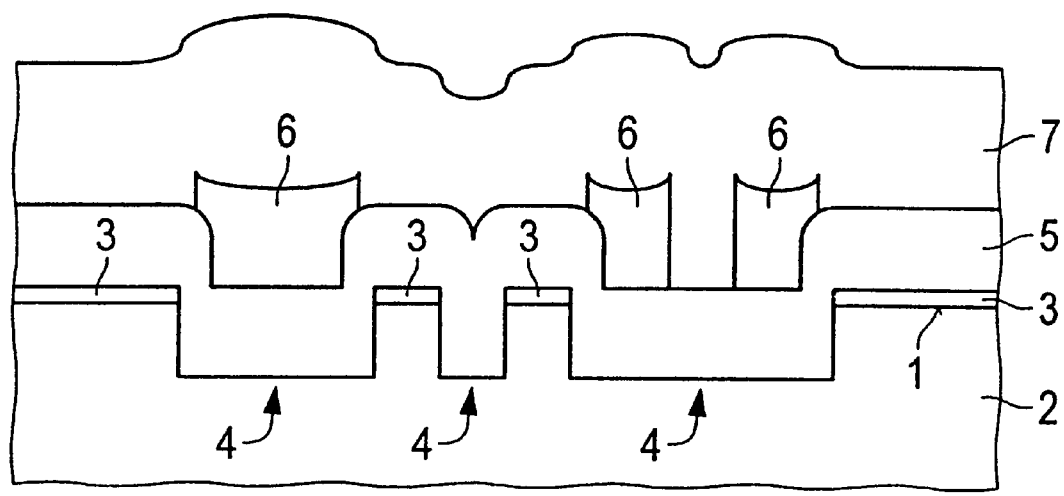
FIG. 3 is a sectional view through a substrate whose main surface has trenches etched in it and on which an insulating layer has been deposited, a mask having been formed on said insulating layer and a photoresist layer having been deposited on said insulating layer.

FIG. 3 shows the production of an integrated circuit configuration with shallow trench isolation, a stop layer 3 made of $Si_3N_4$ is applied in a layer thickness of 100 nm to a main surface 1 of a semiconductor substrate 2 made of monocrystalline silicon. Photolithographic process steps are then used to produce trenches 4 by anisotropic etching. The trenches 4 have a depth of 0.5 $\mu$m. Next, an insulating layer 5 made of $SiO_2$ is applied in a layer thickness of 0.6 $\mu$m over the whole surface. The insulating layer 5 has essentially conformal edge coverage. Narrow trenches 4 are filled by the insulating layer 5, whilst, in both trenches 4, the depth of the trench appears as an unevenness in the surface of the insulating layer 5.

To compensate for the height differences in the surface of the insulating layer 5, a photoresist layer is subsequently deposited in order to form the photoresist mask 6. The mask pattern of the photoresist mask 6 is generated, as illustrated with the aid of FIGS. 1 and 2, on the basis of the pattern of the trenches 4, an allowance which is dependent on the technology, and the structure size F which can be produced as a minimum in the technology used, as a minimum measurement.

Next, a photoresist layer 7 is applied over the whole surface, said photoresist layer 7 largely compensating for the unevenness in the surface of the structure.

Figure 4:
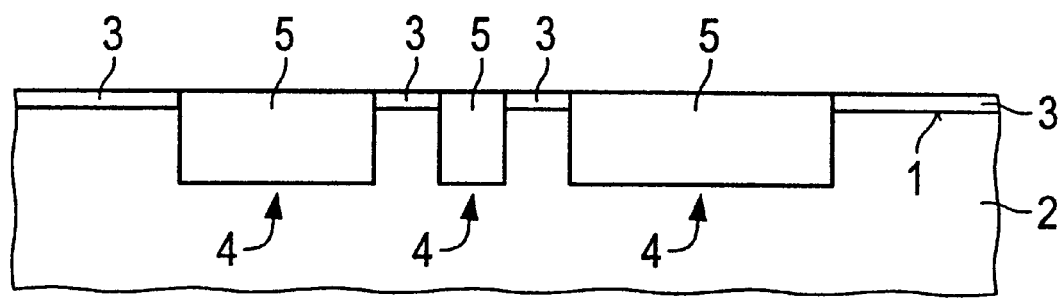
FIG. 4 is a sectional view through the semiconductor substrate after a planarization step using chemical mechanical polishing.

FIG. 4 shows the surface of the structure after being planarized by chemical mechanical polishing. In doing this, the photoresist layer 7 and the photoresist mask 6 are completely removed. The insulating layer 5 is removed in part, so that the surface of the stop layer 3, on which the chemical mechanical polishing process stops, is exposed. At the same time, the trenches 4 are filled with parts of the insulating layer 5.

I claim:

1. A method of producing an integrated circuit configuration, the method which comprises:

forming trenches surrounding active regions in a main surface of a semiconductor substrate;

applying a photoresist layer on an insulating layer and structuring the applied photoresist layer to form a mask using a data processing device programmed to perform the following steps:

providing an idealized pattern representing trenches formed in the semiconductor substrate and having contours which correspond to contours of the trenches and having idealized active regions which represent the active regions in the semiconductor substrate;

producing an idealized mask pattern on the basis of the idealized pattern containing rectilinear contours which are shifted by an allowance in comparison with the idealized pattern, the allowance starting on that side of the idealized active regions which is respectively remote therefrom, the idealized mask pattern having surface zones defined therein which are bounded by the rectilinear contours whose distance apart is shorter than a given minimum measurement; and using the idealized mask pattern to produce a further idealized mask pattern in which the surface zones are replaced by minimum surface elements having length measurements which are greater than the given minimum measurement where a surface of the minimum surface elements essentially corresponds to a surface of the surface zone which the minimum surface elements are replacing, and where the mask is formed from the further idealized mask pattern; and filling the trenches by depositing an insulating layer using the formed mask.

2. The method according to claim 1, wherein the idealized mask pattern has surface regions defined therein spaced apart from adjacent surface regions by a distance which is greater than the prescribed minimum measurement, and replacing surface zones arranged in the surface regions by the minimum surface elements.

3. The method according to claim 1, wherein the surface zones whose surface is smaller than the surface of a minimum surface element are replaced by the minimum surface element, controlled on the basis of a probability corresponding to the quotient formed by the surface of the surface zone and the surface of the minimum surface element.

4. The method according to claim 1, further comprising the step of planarizing the insulating layer by chemical mechanical polishing after the further photolayer has been applied.

5. The method according to claim 1, wherein the prescribed minimum measurement is at least as large as the length of a smallest structure which can be produced in the mask, and in that one of the minimum surface elements is rectangular, the sides of the rectangle having a length which is respectively at least as great as the length of the smallest structure which can be produced in the mask.

* * * * *